(12) United States Patent
Oowada et al.

(10) Patent No.: US 7,563,754 B2
(45) Date of Patent: Jul. 21, 2009

(54) COMPOSITION FOR REMOVING PHOTORESIST RESIDUE AND POLYMER RESIDUE

(75) Inventors: Takuo Oowada, Tokyo (JP); Kaoru Ikegami, Saitama (JP); Norio Ishikawa, Saitama (JP)

(73) Assignee: Kanto Kagaku Kabushiki Kaisha, Tokyo (JP)

( * ) Notice: Subject to any disclaimer, the term of this patent is extended or adjusted under 35 U.S.C. 154(b) by 553 days.

(21) Appl. No.: 11/168,142

(22) Filed: Jun. 28, 2005

(65) Prior Publication Data

US 2005/0288199 A1 Dec. 29, 2005

(30) Foreign Application Priority Data

Jun. 29, 2004 (JP) ............................. 2004-191934

(51) Int. Cl.
*C11D 7/50* (2006.01)
(52) U.S. Cl. ....................................... 510/175; 134/1.3
(58) Field of Classification Search ................. 510/175; 134/1.3
See application file for complete search history.

(56) References Cited

U.S. PATENT DOCUMENTS

| | | | |
|---|---|---|---|
| 6,787,293 B2 | 9/2004 | Oowada et al. | |
| 6,864,044 B2 | 3/2005 | Ishikawa et al. | |
| 2003/0181342 A1* | 9/2003 | Seijo et al. | 510/175 |
| 2004/0002020 A1* | 1/2004 | Oowada et al. | 430/329 |
| 2004/0029051 A1 | 2/2004 | Koita et al. | |
| 2004/0038840 A1 | 2/2004 | Lee et al. | |
| 2004/0106531 A1 | 6/2004 | Kanno et al. | |
| 2004/0224866 A1* | 11/2004 | Matsunaga et al. | 510/175 |
| 2006/0019201 A1* | 1/2006 | Muramatsu et al. | 430/311 |

FOREIGN PATENT DOCUMENTS

| | | |
|---|---|---|
| EP | 1 318 432 A | 6/2003 |
| EP | 1 347 339 A | 9/2003 |
| JP | 2000-306999 A | 2/2000 |
| JP | 2002-99101 A | 4/2002 |
| JP | 2003-167360 A | 6/2003 |
| JP | 2003-241400 A | 8/2003 |
| JP | 2003-280219 A | 10/2003 |
| JP | 2004-94203 A | 3/2004 |
| WO | WO 03/091376 A1 | 11/2003 |

* cited by examiner

*Primary Examiner*—Gregory E Webb
(74) *Attorney, Agent, or Firm*—Wolf, Greenfield & Sacks, P.C.

(57) ABSTRACT

A composition for removing a photoresist residue and a polymer residue remaining on a semiconductor substrate after dry etching and after ashing is provided, the composition containing at least one type of fluorine compound, at least one type of organic acid, at least one type of organic amine, and water, the composition having a pH of 4 to 7, and the total content of components other than water being 0.3 to 30 mass % of the entire composition.

6 Claims, No Drawings

COMPOSITION FOR REMOVING PHOTORESIST RESIDUE AND POLYMER RESIDUE

BACKGROUND OF THE INVENTION

1. Field of the Invention

The present invention relates to a composition for removing a photoresist residue and a polymer residue remaining after dry etching and after ashing.

2. Description of the Related Art

In recent years, to miniaturize semiconductor circuit elements and to increase the performance of them, new wiring materials and interlayer insulating film materials have been employed. For example, copper and an alloy having copper as a main component (hereinafter, called a 'copper alloy') have been used as new wiring materials for the purpose of reducing wiring resistance and inter-wiring capacitance. Copper wiring is formed by, for example, a damascene process in which, after copper is embedded using sputtering or electro-plating in a trench formed as a wiring pattern in an interlayer insulating film, an unwanted copper film portion is removed using chemical mechanical polishing (CMP), etc. Similarly, with regard to the copper alloy, there are examples in which it is used for wiring by a process analogous to the damascene process.

The introduction, as a new interlayer insulating film material, of an organic film represented by an aryl ether compound, a siloxane film represented by HSQ (Hydrogen Silsesquioxane) and MSQ (Methyl Silsesquioxane), and a porous silica film, which are low permittivity (low-k) materials, is also being investigated.

It is however clear that the above-mentioned copper, copper alloy, and various types of low permittivity films have low chemical resistance compared with aluminum, aluminum alloy, and silicon oxide film, which are conventional materials. Moreover, since the various types of low permittivity films, which are new materials, have a chemical composition different from the silicon oxide film, which is a conventional material, a process for fabricating a semiconductor device is carried out under conditions that are different from conventional ones.

In a process for fabricating a semiconductor device dry etching, in which an interlayer insulating film or a wiring material film formed on a substrate is subjected to patterning using a photoresist pattern as a mask, has conventionally been carried out. As a posttreatment for dry etching, after the resist pattern is ashed and removed by an ashing treatment, a photoresist residue, a polymer residue, etc. partially remaining on the treated surface is usually removed by a special purpose composition (remover liquid). The photoresist residue referred to here means an incompletely ashed organic compound such as a photoresist or an anti-reflection film remaining on the substrate surface after dry etching and ashing, and the polymer residue referred to here means a fluorocarbon deposit originating from an etching gas during dry etching that remains on an etched material wall surface as a by-product, a side wall polymer such as a compound between a wiring metal and an etching gas (also called a side wall protecting film or a rabbit ear), and an organometallic polymer and a metal oxide remaining on a side face and a base face of a via hole.

When the interlayer insulating film employs the above-mentioned organic low permittivity film represented by an aryl ether compound, with regard to an etching gas for patterning of the interlayer insulating film, a mixed gas of nitrogen and hydrogen or a mixed gas of nitrogen and helium is generally used. Since during etching these etching gases simultaneously etch a photoresist formed from an organic compound in the same manner as for the organic low permittivity film, an inorganic material (silicon oxide, silicon nitride, etc.) for which the etching gas has a lower selectivity than for the above-mentioned organic low permittivity film may be used as a mask.

When the interlayer insulating film is a siloxane film, represented by MSQ, which is easily altered by ashing, since in the same manner as for the above-mentioned case of the organic low permittivity film a photoresist formed from an organic compound is etched, an inorganic material for which an etching gas has a lower selectivity than for the low permittivity film formed from the siloxane film may be used instead as the mask in dry etching.

In this way, when the interlayer insulating film formed from a low permittivity film is dry etched using as a mask an inorganic material whose selectivity is lower than that of the low permittivity film, an inorganic mask layer formed on the interlayer insulating film is firstly dry etched using a photoresist mask, the photoresist is ashed and removed by ashing, and an inorganic mask pattern is thus obtained. Furthermore, this inorganic mask is used for dry etching of the interlayer insulating film.

After dry etching the interlayer insulating film using the above-mentioned production step, it is mainly a polymer residue that remains on the surface of the substrate, and no photoresist residue, which is an incompletely ashed substance of an organic compound such as a photoresist or an anti-reflection film, remains.

On the other hand, when multilayer wiring is formed, after plasma TEOS covering a lower layer metal wiring pattern is formed, a low permittivity layer covering inter-wiring gaps and the wiring pattern is formed so as to reduce inter-wiring capacitance, on top of this layer a cap layer is then formed by means of plasma TEOS, and after planarization by CMP is carried out, a via hole for a tungsten plug is formed by a photolithographic process using a photoresist (ref. JP, A, 2000-306999). In this case, since a photoresist residue remains on the surface and a polymer residue remains within the via hole, it is necessary to remove them. This demands a composition that is not corrosive toward silicon oxide formed by the plasma TEOS.

In a process for fabricating a semiconductor device using a new material such as copper, a copper alloy, or various types of low permittivity film, there is the new problem that the conventional photoresist residue removal composition cannot be employed. For example, a representative conventional photoresist residue removal composition containing an alkanolamine and a quaternary ammonium compound used for removing a photoresist residue formed on a substrate having aluminum, an aluminum alloy, or a silicon oxide film corrodes copper and copper alloy, which have low corrosion resistance and, furthermore, causes etching and structural change in various types of low-k film.

Hence, as a new type of residue removal composition for removing a photoresist residue and a polymer residue formed on a substrate having copper, a copper alloy, or a low-k film, the following five types have been reported.

1) A composition containing an alkanolamine, a nitrogen-containing compound as a corrosion inhibitor, and water. Examples of the alkanolamine include N-methylaminoethanol and monoethanolamine, and examples of the corrosion inhibitor include uric acid, adenine, caffeine, and purine (ref. JP, A, 2002-99101).

2) A composition containing an aliphatic polycarboxylic acid, a reducing material such as glyoxylic acid, and water.

Examples of the aliphatic polycarboxylic acid include oxalic acid, malonic acid, tartaric acid, malic acid, succinic acid, and citric acid, and examples of the reducing material include glyoxylic acid, ascorbic acid, glucose, and mannose (ref. JP, A, 2003-167360).

3) A composition containing one type or two or more types of fluorine compound, one type or two or more types of glyoxylic acid, etc. and water. The fluorine compound is ammonium fluoride, and examples of the glyoxylic acid, etc. include glyoxylic acid, ascorbic acid, glucose, fructose, lactose, and mannose (ref. JP, A, 2003-280219).

4) A composition containing a fluorine compound such as ammonium fluoride, a water-soluble organic solvent, a buffer agent, water, and a basic compound. Examples of the basic compound include aqueous ammonia, alcoholamines, hydroxylamines, polyalkylene polyamines, piperazines, and morpholines (ref. JP, A, 2003-241400).

5) A composition containing a salt of hydrofluoric acid and a base containing no metal, a water-soluble organic solvent, an organic acid, an inorganic acid, and water. Examples of the organic acid include formic acid, acetic acid, oxalic acid, tartaric acid, and citric acid (ref. JP, A, 2004-94203).

However, the above-mentioned compositions 1) to 5) have the following problems.

With regard to the composition 1), the amount of alkanolamine makes up 40 to 90 mass % of the composition, and the burden on the environment is large.

With regard to the composition 2), it is disclosed in JP, A, 2000-167360 that a photoresist residue can be removed by immersion at 25° C. for 10 minutes. However, when the composition is used in a single wafer washing system, which has been used frequently in recent years and requires a short processing time, its removal performance is not always sufficient.

With regard to the composition 3), as shown in a comparative example of the present application, the etching rate for an altered layer on an MSQ surface formed during dry etching and ashing of a low permittivity film formed from a siloxane film such as MSQ is extremely high. Because of this, when this composition is used, there is a possibility that the actual etching dimensions might be larger than the intended etching dimensions. Furthermore, since this composition has no component that dissolves an organic component, a photoresist residue or a polymer residue containing a large amount of organic component, etc. might not be removed adequately. Moreover, when this composition is recycled within a washing system, after a large number of wafers are treated the content of the components in the composition changes because of concentration due to evaporation of water, consumption of the components by the treatment, dilution by contamination of a rinsing liquid, etc., and target characteristics cannot be obtained.

With regard to the composition 4), since an organic solvent and a basic compound are contained therein, the composition can dissolve an organic component; since a buffer agent is contained therein, consideration has been given to the characteristics not changing accompanying a change in the content of the components when the composition is recycled, but as with the composition 1) the amount of organic solvent makes up 50 mass % or more of the composition, and the burden on liquid waste treatment is very heavy.

With regard to the composition 5), since an organic solvent is contained therein, the composition can dissolve an organic component, but as with the composition 4) the amount of organic solvent makes up 50 mass % or more of the composition, and the burden on liquid waste treatment is very heavy.

SUMMARY OF THE INVENTION

It is therefore an object of the present invention to provide a photoresist residue and polymer residue removal composition that can remove a photoresist residue and a polymer residue after dry etching and after ashing without changing processed dimensions of an interlayer insulating film, for which the residue removal characteristics do not change accompanying a change in constitution when recycled, and for which the burden on the environment is suppressed.

During an intensive investigation with the above-mentioned problems in mind, the present inventors have found that the above-mentioned problems can all be solved by a photoresist residue and polymer residue removal composition comprising at least one type of fluorine compound, at least one type of organic acid, at least one type of organic amine, and water, and with a pH that is set at weakly acidic to neutral, and as a result of a further investigation, the present invention has been accomplished.

That is, the present invention relates to a composition for removing a photoresist residue and a polymer residue remaining on a semiconductor substrate after dry etching and after ashing, the composition comprising at least one type of fluorine compound, at least one type of organic acid, at least one type of organic amine, and water, the composition having a pH of 4 to 7, and the total content of components other than water being 0.3 to 30 mass % of the entire composition.

Furthermore, the present invention relates to the composition for removing a photoresist residue and a polymer residue, wherein the composition further comprises at least one type of corrosion inhibitor.

Moreover, the present invention relates to the composition for removing a photoresist residue and a polymer residue, wherein the corrosion inhibitor is at least one type selected from the group consisting of glyoxylic acid, glucose, fructose, and mannose.

Furthermore, the present invention relates to the composition for removing a photoresist residue and a polymer residue, wherein the corrosion inhibitor is glyoxylic acid.

Moreover, the present invention relates to the composition for removing a photoresist residue and a polymer residue, wherein the fluorine compound is ammonium fluoride.

Furthermore, the present invention relates to the composition for removing a photoresist residue and a polymer residue, wherein the organic acid is at least one type selected from the group consisting of oxalic acid, tartaric acid, citric acid, malonic acid, and malic acid.

Moreover, the present invention relates to the composition for removing a photoresist residue and a polymer residue, wherein the organic amine is at least one type selected from the group consisting of alkanolamines, cyclohexylamines, morpholines, piperidines, and piperazines.

Furthermore, the present invention relates to the composition for removing a photoresist residue and a polymer residue, wherein the composition comprises as a surfactant at least one of a nonionic surfactant, an anionic surfactant, and a fluorine based surfactant.

Moreover, the present invention relates to the composition for removing a photoresist residue and a polymer residue, wherein the composition is used for a substrate comprising copper or a copper alloy as a wiring material and a low permittivity (low-k) film as an interlayer insulating film material.

Furthermore, the present invention relates to a process for removing a photoresist residue and a polymer residue, the process employing the composition for removing a photoresist residue and a polymer residue.

The composition for removing a photoresist residue and a polymer residue referred to in the present specification means a composition, etc. used for removing a photoresist residue and a polymer residue remaining on a semiconductor substrate after carrying out dry etching using a photoresist as a mask and further ashing, or on a semiconductor substrate after carrying out dry etching using an inorganic material as a mask.

Since the composition for removing a photoresist residue and a polymer residue of the present invention contains a fluorine compound, it has a high ability to remove a residue containing silicon remaining after dry etching and after ashing. The composition for removing residues of the present invention regulates the pH of the composition at a predetermined level and maintains the pH constant with changes in the content of the components accompanying dilution, concentration, etc. by optimizing the type, the content, and the proportion of the organic acid and organic amine components. The fluorine compound of the composition, for example, ammonium fluoride, dissociates to $HF_2^-$ in aqueous solution as shown in the expression below.

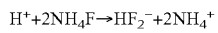

$$H^+ + 2NH_4F \rightarrow HF_2^- + 2NH_4^+$$

The concentration of $HF_2^-$ depends on the pH of the solution; the lower the pH, the higher the concentration of $HF_2^-$, and the higher the pH, the lower the concentration of $HF_2^-$. When the pH decreases, the effect in etching a photoresist residue and a polymer residue increases, but when the pH is too low, even an insulating film material and an altered layer thereof are etched. On the other hand, when the pH is too high, the removability of a residue is inadequate, and copper might be corroded. In the composition for removing residues of the present invention, the pH of the composition is set in the range of 4 to 7 by means of the organic acid and the organic amine in order to adjust the concentration of $HF_2^-$ so as to achieve optimum etching.

The organic amine has a high ability to remove a residue containing a large amount of organic component. Furthermore, by adding a corrosion inhibitor, corrosion of a metal material can be prevented. In particular, even when a metal material is exposed on a substrate surface that is to be treated with the residue removal composition, glyoxylic acid, which is a reducing material, can control the transfer of electrons between the photoresist residue and polymer residue removal composition and a metal material such as copper, and prevent corrosion of the metal material.

Furthermore, because the composition for removing a photoresist residue and a polymer residue of the present invention contains at least one type of organic acid, the composition has a high ability to remove a polymer residue having copper oxide as a main component that remains on the base of a via hole after dry etching and after ashing, without corroding copper that is used as a wiring material.

EFFECTS OF THE INVENTION

As hereinbefore described, in accordance with the composition for removing a photoresist residue and a polymer residue of the present invention, while suppressing metal corrosion, etching of an altered layer formed on an etched surface during dry etching and ashing of an interlayer insulating film, and etching of the interlayer insulating film itself, a residue remaining after dry etching and after ashing can be removed adequately. Because of this, it is possible to remove the residue from the etched surface while maintaining the etched shape. Furthermore, since the composition is formed as an aqueous solution without using a water-soluble organic solvent, it is possible to reduce the burden on the environment.

BEST MODE FOR CARRYING OUT THE INVENTION

The composition for removing a photoresist residue and a polymer residue of the present invention is used for removing a photoresist residue and a polymer residue remaining after dry etching and after ashing of an interlayer insulating film, and is formed as an aqueous solution comprising at least one type of fluorine compound, at least one type of organic acid, at least one type of organic amine, and water.

The fluorine compounds used in the present invention are hydrofluoric acid or ammonium or amine fluoride salts thereof, and examples of the fluoride salts include ammonium fluoride, ammonium hydrogen fluoride, methylamine hydrofluoride, ethylamine hydrofluoride, propylamine hydrofluoride, tetramethylammonium fluoride, tetraethylammonium fluoride, ethanolamine hydrofluoride, methylethanolamine hydrofluoride, dimethylethanolamine hydrofluoride, and triethylenediamine hydrofluoride. Among these, ammonium fluoride is particularly preferable since it has a low metallic impurity content and it When an interlayer insulating film, etc. on wiring formed from copper or a copper alloy is dry etched, a photoresist residue and a polymer residue remaining on an etched wall face and base contain a reaction product formed from a mixture of copper oxide, a photoresist material, an inorganic mask material such as silicon oxide, an interlayer insulating film material, and an etching gas, etc. These residues have different constitutions according to the material that has been dry etched and the processing conditions, such as the dry etching conditions and the ashing conditions; for example, when the interlayer insulating film is HSQ, MSQ, etc., a residue containing a large amount of silicon is formed, and when a photoresist mask is used or processing conditions in which a fluorocarbon originating from the etching gas is deposited on an etched wall face are employed, a residue containing a large amount of organic component is formed.

The fluorine compound contained in the composition dissolves a polymer residue containing a large amount of silicon, and strips off a photoresist residue in a short time. The content of the fluorine compound is appropriately determined depending on the material to be dry etched, the processing conditions, and the residue removability, and is preferably 0.1 to 3 mass % relative to the entire composition, and particularly preferably 0.2 to 2 mass %. When the content of the fluorine compound is too low, the residue removability is inadequate, and when it is too high there is corrosion of not only an altered layer of a silicon type interlayer insulating film but also of the interlayer insulating film itself and the wiring material.

The corrosion inhibitor contained in the composition mainly prevents the corrosion of copper. As the corrosion inhibitor, sorbitol, catechol, benzotriazole, glyoxylic acid, ascorbic acid, glucose, fructose, lactose, mannose, etc. can be used. Among these corrosion inhibitors, corrosion inhibitors such as a sugar alcohol (sorbitol, etc.), an aromatic hydroxy compound (catechol, etc.), and a nitrogen-containing aromatic compound (benzotriazole, etc.) can be added to the photoresist residue removal composition together with water and a photoresist residue removal component such as, for example, a fluorine compound, a water-soluble amine compound, or an aliphatic polycarboxylic acid. It is surmised that these corrosion inhibitors form a coating of an insoluble chelate compound on the copper surface, thus suppressing contact between the photoresist residue removal component and the metal and preventing corrosion.

On the other hand, it is surmised that since corrosion inhibitors such as glyoxylic acid, ascorbic acid, or a saccharide (glucose, fructose, lactose, mannose, etc.) are reducing materials, they control the redox potential of residue removal composition, thus suppressing electron transfer between the residue removal composition and each type of metal and preventing corrosion. Corrosion of a metal in an aqueous solution depends on the pH, the redox potential, the temperature of the aqueous solution, the presence of a chelating agent, and the coexistence of another metal in the aqueous solution; in particular, the pH and the redox potential of the solution play an important role. It is surmised that, by controlling these factors, corrosion of a metal in the aqueous solution can be prevented. With regard to the corrosion inhibitor used in the present invention, glyoxylic acid, ascorbic acid, saccharides (glucose, fructose, lactose, mannose, etc.), etc. are preferable because of excellent corrosion inhibition and residue removability. Among these, since ascorbic acid gradually decomposes in an aqueous solution, glyoxylic acid and saccharides (glucose, fructose, lactose, mannose, etc.) are preferable from the viewpoint of stability. In particular, glyoxylic acid is more preferable since it has higher acidity than the saccharides (glucose, fructose, lactose, mannose, etc.) and a sufficient amount of $HF_2^-$ for removing the residue can be formed from a small amount added.

The content of the corrosion inhibitor may be appropriately determined from the viewpoint of the material to be dry etched, the processing conditions, the residue removability, suppression of corrosion of the wiring material and the interlayer insulating film material, the cost, and the presence or absence of precipitates and crystals, but it is preferably 0.01 to 1 mass % relative to the entire composition, and particularly preferably 0.03 to 0.3 mass %. When the content of the corrosion inhibitor is too small, the residue removability and the copper corrosion inhibition are inadequate, and when it is too high, there is corrosion of not only an altered layer of a silicon type interlayer insulating film but also of the interlayer insulating film itself.

The organic acid used in the present invention may be a normal organic acid such as a carboxylic acid, a sulfonic acid, or a phosphonic acid and preferable examples thereof include carboxylic acids such as formic acid, acetic acid, propionic acid, butyric acid, acrylic acid, methacrylic acid, oxalic acid, glycolic acid, malonic acid, maleic acid, tartaric acid, citric acid, and malic acid. Among these, oxalic acid, malonic acid, tartaric acid, citric acid, and malic acid, are more preferable.

The organic acid dissolves a residue containing a large amount of a metal oxide such as copper oxide. The content of the organic acid may be appropriately determined according to the material to be dry etched, the processing conditions, and the residue removability (the pH of the composition), and is preferably about 0.1 to 20 mass % relative to the entire composition, and particularly preferably about 1 to 10 mass %. When the content of the organic acid is too low, the residue removability is inadequate, and when it is too high, there is corrosion of not only an altered layer of a silicon type interlayer insulating film but also of the interlayer insulating film itself and the wiring material.

Examples of the organic amine used in the present invention include alkanolamines such as monoethanolamine, monopropanolamine, isopropanolamine, N-methylethanolamine, N-ethylethanolamine, N-butylethanolamine, N,N-diethylethanolamine, N,N-butylethanolamine, N-methylpropanolamine, N,N-dimethylpropanolamine, N,N-diethylpropanolamine, diglycolamine, diethanolamine, dipropanolamine, diisopropanolamine, triethanolamine, tripropanolamine, and triisopropanolamine, cyclohexylamines such as cyclohexylamine and N-alkylcyclohexylamines, morpholines such as morpholine and alkylmorpholines, piperidines such as piperidine and alkylpiperidines, and piperazines such as piperazine and alkylpiperazines. Among these, monoethanolamine, diethanolamine, triethanolamine, diglycolamine, morpholine, piperidine, and piperazine, which are readily available as relatively high purity products for a semiconductor fabrication process, are preferable.

The organic amine is contained in the composition as a component dissolving a residue that contains a large amount of an organic component. The content of the organic amine is preferably about 0.1 to 15 mass % relative to the entire composition, more preferably about 0.5 to 10 mass %, and particularly preferably about 1 to 5 mass %. When the content of the organic amine is too low, the removability for a residue that contains a large amount of organic component is inadequate, and when it is too high, the removability for a residue that contains a large amount of silicon is inadequate.

The residue removal composition of the present invention does not employ a water-soluble organic solvent apart from the organic amine, and is formed as an aqueous solution. The total content of components other than water is 0.3 to 30 mass % relative to the entire composition, preferably 0.3 to 20 mass %, and particularly preferably 3 to 15 mass %. In the case of an organic solvent or a large amount of the organic amine, there is the problem that copper and a copper alloy, which are wiring materials having poor corrosion resistance, a low-k film, etc. are corroded. The residue removal composition of the present invention can obtain a sufficient effect with a small amount of components other than water without using an organic solvent; the above-mentioned problem of corrosion can be eliminated, and the burden on the environment is small.

The pH of the residue removal composition is 4 to 7, and preferably 5 to 7. This enables the concentration of $HF_2^-$ in the composition to be adjusted in the optimum range for etching. Furthermore, a buffer effect between the organic acid and the organic amine in the composition enables the pH of the composition to be maintained constant with variations in the concentration of the components, and when the remover liquid is recycled in a single wafer washing system, the life time of the remover liquid can be increased without changing characteristics such as residue removability and corrosion resistance.

Furthermore, even in a substrate having plasma TEOS, by optimizing the pH of the composition it is possible to carry out control so that the plasma TEOS is not etched by $HF_2^-$ in the same way as for the insulating film material and an altered layer thereof.

Moreover, the residue removal composition of the present invention may contain a surfactant in the composition in order to impart hydrophilicity to a water repellent film such as a low-k film. The surfactant is preferably a nonionic surfactant such as a polyoxyalkylene alkyl ether type or a polyoxyalkylene alkylphenyl ether type, an anionic surfactant such as an alkylbenzenesulfonic acid type or a salt thereof, an alkylphosphoric acid ester type, a polyoxyalkylene alkylphenyl ether sulfonic acid or a salt thereof, or a polyoxyalkylene alkyl ether sulfonic acid or a salt thereof, a fluorine based surfactant, etc. The concentration of the surfactant is preferably 0.0001 to 10 mass %, and particularly preferably 0.001 to 5 mass %. When the concentration of the surfactant is low, the wettability toward a low-k film is degraded, and when the concentration thereof is high, an effect commensurate with the concentration cannot be expected.

EXAMPLES

The composition for removing a photoresist residue and a polymer residue of the present invention is explained in further detail by reference to Examples and Comparative Examples, but the present invention should not be construed as being limited by these examples.

Examples 1 to 43 and Comparative Examples 1 to 8

Process for Preparing Composition for Removing a Photoresist Residue and a Polymer Residue
(1) A specified organic acid weighed according to the amount to be charged shown in Table 1 was put into superpure water weighed according to the amount to be charged, and the mixture was stirred until a uniform mixture was obtained (solution A).
(2) A specified organic amine weighed according to the amount to be charged shown in Table 1 was put into the solution A, and the mixture was stirred until a uniform mixture was obtained (solution B).
(3) A specified fluorine compound and glyoxylic acid weighed according to the amounts to be charged shown in Table 1 were put into the solution B, and the mixture was stirred until a uniform mixture was obtained.

Residue Removability and Corrosion Evaluation—1 (Effect of Change in Constitution of Residue Removal Composition)

Cu damascene wiring using Ta as a barrier metal and an interlayer insulating film (SIOC type low-k film) were formed in sequence on top of a silicon wafer, a via hole was formed by dry etching using as a mask a photoresist formed on the interlayer insulating film by coating, exposure, and development, the photoresist was then removed by ashing, and a wafer on which a photoresist residue and a polymer residue were formed was obtained. For each residue removal composition, a wafer was immersed at 25° C. for 90 seconds, followed by rinsing with running superpure water and drying, and the ability to remove the photoresist residue and the polymer residue and the corrosion of copper and the low-k film were confirmed using an electron microscope. The results are given in Table 1.

TABLE 1

| | Remover liquid composition (mass %) | | | | | | | | | pH | Removability *1 Copper surface | Removability *1 Via side wall | Corrosion Copper *2 | Corrosion Low-k film *3 |
|---|---|---|---|---|---|---|---|---|---|---|---|---|---|---|
| Comp. Ex. 1 | NMEA *4 | 95 | Uric acid | 1 | | | | | | — | C | D | B | B |
| Comp. Ex. 2 | Oxalic acid | 3.4 | Glyoxylic acid | 0.03 | | | | | | — | A | D | A | A |
| Comp. Ex. 3 | HF | 0.05 | | | | | | | | — | A | C | A | D |
| Comp. Ex. 4 | NH$_4$F | 0.5 | | | | | | | | — | C | D | D | A |
| Comp. Ex. 5 | NH$_4$F | 0.2 | Glyoxylic acid | 0.03 | | | | | | — | C | A | A | D |
| Comp. Ex. 6 | NH$_4$F | 0.2 | Glyoxylic acid | 0.09 | | | | | | — | C | A | A | D |
| Comp. Ex. 7 | NH$_4$F | 0.5 | DMAc *5 | 66 | ADA *6 | 3 | Ammonia | 0.2 | | — | A | D | A | D |
| Comp. Ex. 8 | NH$_4$F DEEA *10 | 0.1 3 | DMSO *7 Oxalic acid | 21 1 | DGME *8 | 49 | MDP *9 | 5 | | — | A | D | A | B |
| Example 1 | NH$_4$F | 0.2 | Glyoxylic acid | 0.2 | Citric acid | 2 | Piperazine | 1.5 | | 5.5 | A | A | A | A |
| Example 2 | NH$_4$F | 0.5 | Glyoxylic acid | 0.2 | Citric acid | 2 | Piperazine | 1.5 | | 5.6 | A | A | A | A |
| Example 3 | NH$_4$F | 2 | Glyoxylic acid | 0.2 | Citric acid | 2 | Piperazine | 1.5 | | 6.0 | A | A | A | A |
| Example 4 | NH$_4$F | 0.5 | Glucose | 0.2 | Citric acid | 2 | Piperazine | 1.5 | | 5.9 | A | A | A | A |
| Example 5 | NH$_4$F | 0.2 | Glyoxylic acid | 0.1 | Citric acid | 2 | Piperazine | 1.5 | | 5.9 | A | A | A | A |
| Example 6 | NH$_4$F | 0.5 | Glyoxylic acid | 0.03 | Citric acid | 2 | Piperazine | 1.5 | | 6.3 | A | A | A | A |
| Example 7 | NH$_4$F | 0.5 | Glyoxylic acid | 0.3 | Citric acid | 2 | Piperazine | 1.5 | | 5.1 | A | A | A | A |
| Example 8 | NH$_4$F | 0.5 | Glyoxylic acid | 0.2 | Citric acid | 1 | Piperazine | 1.5 | | 6.0 | A | A | A | A |
| Example 9 | NH$_4$F | 0.5 | Glyoxylic acid | 0.2 | Citric acid | 5 | Piperazine | 1.5 | | — | A | A | A | A |
| Example 10 | NH$_4$F | 0.5 | Glyoxylic acid | 0.2 | Citric acid | 10 | Piperazine | 1.5 | | — | A | A | A | A |
| Example 11 | NH$_4$F | 0.5 | Glyoxylic acid | 0.2 | Citric acid | 2 | Piperazine | 1 | | 5.2 | A | A | A | A |
| Example 12 | NH$_4$F | 0.5 | Glyoxylic acid | 0.2 | Citric acid | 2 | Piperazine | 5 | | — | A | A | A | A |
| Example 13 | NH$_4$F | 0.5 | Glyoxylic acid | 0.2 | Tartaric acid | 2 | Piperazine | 1.5 | | 5.4 | A | A | A | A |
| Example 14 | NH$_4$F | 0.5 | Glyoxylic acid | 0.2 | Malonic acid | 2 | Piperazine | 1.5 | | 5.4 | A | A | A | A |
| Example 15 | NH$_4$F | 0.5 | Glyoxylic acid | 0.2 | Malic acid | 2 | Piperazine | 1.5 | | 5.6 | A | A | A | A |
| Example 16 | NH$_4$F | 0.5 | Glyoxylic acid | 0.2 | Citric acid | 2 | MEA | 1.5 | | 5.4 | A | A | B | A |
| Example 17 | NH$_4$F | 0.5 | Glyoxylic acid | 0.2 | Citric acid | 2 | DEA | 1.5 | | 5.5 | A | A | B | A |

TABLE 1-continued

|  |  |  |  |  |  |  |  | pH | Removability *1 | | Corrosion | |
|---|---|---|---|---|---|---|---|---|---|---|---|---|
|  | Remover liquid composition (mass %) | | | | | | | | Copper surface | Via side wall | Copper *2 | Low-k film *3 |
| Example 18 | NH₄F | 0.5 | Glyoxylic acid | 0.2 | Citric acid | 2 | TEA | 1.5 | 5.7 | A | A | B | A |
| Example 19 | NH₄F | 0.5 | Glyoxylic acid | 0.2 | Citric acid | 2 | DGA | 1.5 | 5.5 | A | A | B | A |
| Example 20 | NH₄F | 0.5 | Glyoxylic acid | 0.2 | Citric acid | 2 | CHA *11 | 1.5 | 5.7 | A | A | B | A |
| Example 21 | NH₄F | 0.5 | Glyoxylic acid | 0.2 | Citric acid | 2 | CHA *11 | 1 | 5.4 | A | A | B | A |
| Example 22 | NH₄F | 0.5 | Glyoxylic acid | 0.2 | Citric acid | 5 | CHA *11 | 5 | — | A | A | B | A |
| Example 23 | NH₄F | 0.5 | Glyoxylic acid | 0.2 | Citric acid | 2 | Morpholine | 1.5 | 5.3 | A | A | A | A |
| Example 24 | NH₄F | 0.5 | Glyoxylic acid | 0.2 | Citric acid | 2 | Morpholine | 1 | 5.0 | A | A | A | A |
| Example 25 | NH₄F | 0.5 | Glyoxylic acid | 0.2 | Citric acid | 5 | Morpholine | 5 | — | A | A | A | A |
| Example 26 | NH₄F | 0.5 | Glyoxylic acid | 0.2 | Citric acid | 2 | Piperidine | 1.5 | 6.0 | A | A | A | A |
| Example 27 | NH₄F | 0.5 | Glyoxylic acid | 0.2 | Citric acid | 2 | Piperidine | 1 | 5.7 | A | A | A | A |
| Example 28 | NH₄F | 0.5 | Glyoxylic acid | 0.2 | Citric acid | 5 | Piperidine | 5 | — | A | A | A | A |

*1: A very good, B good, C some remaining, D impossible to remove,
*2: A no corrosion, B hardly any corrosion, C slightly rough surface, D etching occurred,
*3: A no corrosion, B hardly any corrosion, C slightly rough surface, D etching occurred,
*4: N-methylmonoethanolamine,
*5: dimethylacetamide,
*6: N-(2-acetamid)iminodiacetic acid,
*7: dimethylsulfoxide,
*8: diethylene glycol monomethyl ether,
*9: methylenediphosphonic acid,
*10: N,N-diethylethanolamine,
*11: cyclohexylamine The compositions of Examples 1 to 28 had good residue removability and good corrosion resistance; in particular, in examples in which piperazine, morpholine, or piperidine was used as the organic amine, corrosion of copper was not observed at all. On the other hand, it was found that the compositions of Comparative Examples 1 to 8 had poor residue removability on the copper surface or the via side wall, or poor corrosion resistance for copper or the low-k film. With regard to Example 2, where glyoxylic acid was used, and Example 4, where glucose was used, the pH of Example 2 was slightly lower than that of Example 4, and both examples showed equally good residue removability and corrosion resistance.

Residue Removability and Corrosion Evaluation—2 (Effect of Change in Constitution of Residue Removal Composition)

Cu damascene wiring using Ta as a barrier metal and an interlayer insulating film (MSQ type porous low-k film) were formed in sequence on top of a silicon wafer, a via hole was formed by dry etching using as a mask a photoresist formed on the interlayer insulating film by coating, exposure, and development, the photoresist was then removed by ashing, and a wafer on which a photoresist residue and a polymer residue were formed was obtained. For each residue removal composition, a wafer was immersed at 25° C. for 90 seconds, followed by rinsing with running superpure water and drying, and the ability to remove the photoresist residue and the polymer residue and the corrosion of copper and the low-k film were confirmed using an electron microscope. The results are given in Table 2.

TABLE 2

|  |  |  |  |  |  |  |  | pH | Removability *1 | | Corrosion | |
|---|---|---|---|---|---|---|---|---|---|---|---|---|
|  | Remover liquid composition (mass %) | | | | | | | | Copper surface | Via side wall | Copper *2 | Low-k film *3 |
| Example 29 | NH₄F | 0.5 | Glyoxylic acid | 0.2 | Citric acid | 2 | Piperazine | 1.5 | 5.6 | A | A | A | A |
| Example 30 | NH₄F | 0.5 | Glyoxylic acid | 0.2 | tartaric acid | 2 | Piperazine | 1.5 | 5.4 | A | A | A | A |
| Example 31 | NH₄F | 0.5 | Glyoxylic acid | 0.2 | malonic acid | 2 | Piperazine | 1.5 | 5.4 | A | A | A | A |
| Example 32 | NH₄F | 0.5 | Glyoxylic acid | 0.2 | malic acid | 2 | Piperazine | 1.5 | 5.6 | A | A | A | A |
| Example 33 | NH₄F | 0.5 | Glyoxylic acid | 0.2 | Citric acid | 2 | Piperazine | 1 | 5.2 | A | A | A | A |

TABLE 2-continued

| | Remover liquid composition (mass %) | | | | | | | pH | Removability *1 | | Corrosion | |
|---|---|---|---|---|---|---|---|---|---|---|---|---|
| | | | | | | | | | Copper surface | Via side wall | Copper *2 | Low-k film *3 |
| Example 34 | NH₄F | 0.5 | Glyoxylic acid | 0.2 | Citric acid | 5 | Piperazine | 5 | — | A | A | A | A |
| Example 35 | NH₄F | 0.5 | Glyoxylic acid | 0.2 | Citric acid | 2 | CHA *4 | 1.5 | 5.7 | A | A | B | A |
| Example 36 | NH₄F | 0.5 | Glyoxylic acid | 0.2 | Citric acid | 2 | CHA *4 | 1 | 5.4 | A | A | B | A |
| Example 37 | NH₄F | 0.5 | Glyoxylic acid | 0.2 | Citric acid | 5 | CHA *4 | 5 | — | A | A | B | A |
| Example 38 | NH₄F | 0.5 | Glyoxylic acid | 0.2 | Citric acid | 2 | Morpholine | 1.5 | 5.3 | A | A | A | A |
| Example 39 | NH₄F | 0.5 | Glyoxylic acid | 0.2 | Citric acid | 2 | Morpholine | 1 | 5.0 | A | A | A | A |
| Example 40 | NH₄F | 0.5 | Glyoxylic acid | 0.2 | Citric acid | 5 | Morpholine | 5 | — | A | A | A | A |
| Example 41 | NH₄F | 0.5 | Glyoxylic acid | 0.2 | Citric acid | 2 | Piperidine | 1.5 | 6.0 | A | A | A | A |
| Example 42 | NH₄F | 0.5 | Glyoxylic acid | 0.2 | Citric acid | 2 | Piperidine | 1 | 5.7 | A | A | A | A |
| Example 43 | NH₄F | 0.5 | Glyoxylic acid | 0.2 | Citric acid | 5 | Piperidine | 5 | — | A | A | A | A |

*1: A very good, B good, C some remaining, D impossible to remove,
*2: A no corrosion, B hardly any corrosion, C slightly rough surface, D etching occurred or component penetrated,
*3: A no corrosion, B hardly any corrosion, C slightly rough surface, D etching occurred,
*4: cyclohexylamine As is clear from Table 2, the compositions of Examples 29 to 43 had a good residue removability and good corrosion resistance. Furthermore, since the content of the organic amine was low, the performance of a porosified low-k film was not degraded.

Residue Removability and Corrosion Evaluation—3 (Effect of Dilution and Concentration)

Cu damascene wiring using Ta as a barrier metal and an interlayer insulating film (MSQ type porous low-k film) were formed in sequence on top of a silicon wafer, a via hole was formed by dry etching using as a mask a photoresist formed on the interlayer insulating film by coating, exposure, and development, the photoresist was then removed by ashing, and a wafer on which a photoresist residue and a polymer residue were formed was obtained. For each residue removal composition formed by changing the content of each component of the residue removal composition (NH₄F 0.5 mass %, glyoxylic acid 0.2 mass %, citric acid 2.0 mass %, and piperazine 1.5 mass %) by 0.5, 0.7, 1.3, and 1.5 times, a wafer was immersed at 25° C. for 90 seconds, followed by rinsing with running superpure water and drying, and the ability to remove the photoresist residue and the polymer residue and the corrosion of copper and the low-k film were confirmed using an electron microscope. The results are given in Table 3.

TABLE 3

| | Remover liquid composition (mass %) | | | | | | | | pH | Removability *1 | | Corrosion | |
|---|---|---|---|---|---|---|---|---|---|---|---|---|---|
| | | | | | | | | | | Copper surface | Via side wall | Copper *2 | Low-k film *3 |
| Example 29 | NH₄F | 0.5 | Glyoxylic acid | 0.2 | Citric acid | 2 | Piperazine | 1.5 | 5.6 | A | A | A | A |
| Example 44 | Content of each component × 0.5 | | | | | | | | 5.6 | A | A | A | A |
| Example 45 | Content of each component × 0.7 | | | | | | | | 5.6 | A | A | A | A |
| Example 46 | Content of each component × 1.3 | | | | | | | | 5.6 | A | A | A | A |
| Example 47 | Content of each component × 1.5 | | | | | | | | 5.6 | A | A | A | A |

*1: A very good, B good, C some remaining, D impossible to remove,
*2: A no corrosion, B hardly any corrosion, C slightly rough surface, D etching occurred or component penetrated,
*3: A no corrosion, B hardly any corrosion, C slightly rough surface, D etching occurred From Table 3 it can be seen that, when the residue removal composition of the present invention was diluted or concentrated by 0.5 to 1.5 times, the pH of the composition did not change, and the residue removability and the corrosion resistance were good.

Evaluation of Amount of Plasma TEOS Etched

A wafer in which a plasma TEOS film was formed on a silicon wafer was prepared, and the film thickness of the plasma TEOS was measured using a interferometric film thickness measurement system (Nanospec AFT manufactured by Nanometrics). Subsequently, for each residue removal composition a wafer was immersed at 25° C. for 30 minutes without stirring, followed by rinsing with running superpure water and drying. Following this, the film thickness was measured using the interferometric film thickness measurement system, and the amount of etching was calculated from the change in film thickness of the plasma TEOS before and after the treatment with the residue removal composition. The results are given in Table 4.

TABLE 4

| | Remover liquid composition (mass %) | | | | | | | pH | Amount of plasma TEOS etched (Å/30 min.) |
|---|---|---|---|---|---|---|---|---|---|
| Example 48 | NH₄F | 0.5 | Glyoxylic acid | 0.2 | Citric acid | 2 | Piperazine | 1.5 | 5.6 | 10↓ |
| Example 30 | NH₄F | 0.5 | Glyoxylic acid | 0.2 | Tartaric acid | 2 | Piperazine | 1.5 | 5.4 | 10↓ |
| Example 31 | NH₄F | 0.5 | Glyoxylic acid | 0.2 | Malonic acid | 2 | Piperazine | 1.5 | 5.4 | 10↓ |
| Example 32 | NH₄F | 0.5 | Glyoxylic acid | 0.2 | Malic acid | 2 | Piperazine | 1.5 | 5.6 | 10↓ |
| Example 33 | NH₄F | 0.5 | Glyoxylic acid | 0.2 | Citric acid | 2 | Piperazine | 1 | 5.2 | 15 |
| Example 34 | NH₄F | 0.5 | Glyoxylic acid | 0.2 | Citric acid | 5 | Piperazine | 5 | — | 10↓ |
| Example 35 | NH₄F | 0.5 | Glyoxylic acid | 0.2 | Citric acid | 2 | CHA *1 | 1.5 | 5.7 | 10↓ |
| Example 36 | NH₄F | 0.5 | Glyoxylic acid | 0.2 | Citric acid | 2 | CHA *1 | 1 | 5.4 | 10↓ |
| Example 37 | NH₄F | 0.5 | Glyoxylic acid | 0.2 | Citric acid | 5 | CHA *1 | 5 | — | 10↓ |
| Example 38 | NH₄F | 0.5 | Glyoxylic acid | 0.2 | Citric acid | 2 | Morpholine | 1.5 | 5.3 | 13 |
| Example 39 | NH₄F | 0.5 | Glyoxylic acid | 0.2 | Citric acid | 2 | Morpholine | 1 | 5.0 | 17 |
| Example 40 | NH₄F | 0.5 | Glyoxylic acid | 0.2 | Citric acid | 5 | Morpholine | 5 | — | 10↓ |
| Example 41 | NH₄F | 0.5 | Glyoxylic acid | 0.2 | Citric acid | 2 | Piperidine | 1.5 | 6.0 | 10↓ |
| Example 42 | NH₄F | 0.5 | Glyoxylic acid | 0.2 | Citric acid | 2 | Piperidine | 1 | 5.7 | 10↓ |
| Example 43 | NH₄F | 0.5 | Glyoxylic acid | 0.2 | Citric acid | 5 | Piperidine | 5 | — | 13 |

*1: cyclohexylamine

The amount of plasma TEOS film etched by the residue removal composition of the present invention was 17 Å/30 minutes or less in all cases (in Table 4, 10↓ denotes a value equal to or less than a detection limit of 10 Å), and it can be seen that there was little corrosion of the plasma TEOS film.

What is claimed is:

1. A composition for removing a photoresist residue and a polymer residue remaining on a semiconductor substrate after dry etching and after ashing, the composition comprising at least one type of fluorine compound, at least one type of organic acid selected from the group consisting of oxalic acid, tartaric acid, citric acid, malonic acid, and malic acid, at least one type of organic amine, glyoxylic acid and water, the composition having a pH of 4 to 7, and the total content of components other than water being 0.3 to 30 mass % of the entire composition.

2. The composition for removing a photoresist residue and a polymer residue according to claim 1, wherein the fluorine compound is ammonium fluoride.

3. The composition for removing a photoresist residue and a polymer residue according to claim 1, wherein the organic amine is at least one type selected from the group consisting of alkanolamines, cyclohexylamines, morpholines, piperidines, and piperazines.

4. The composition for removing a photoresist residue and a polymer residue according to claim 1, wherein the composition comprises as a surfactant at least one of a nonionic surfactant, an anionic surfactant, and a fluorine based surfactant.

5. The composition for removing a photoresist residue and a polymer residue according to claim 1, wherein the composition is used for a substrate comprising copper or a copper alloy as a wiring material and a low permittivity (low-k) film as an interlayer insulating film material.

6. A process for removing a photoresist residue and a polymer residue, the process employing the composition for removing a photoresist residue and a polymer residue according to claim 1.

* * * * *